United States Patent
Blodgett

(10) Patent No.: US 7,456,706 B2
(45) Date of Patent: Nov. 25, 2008

(54) METHOD AND APPARATUS FOR ELECTRICALLY ADJUSTING DELAY IN RADIO-FREQUENCY SYSTEMS

(75) Inventor: James R. Blodgett, Walnut Creek, CA (US)

(73) Assignee: SOMA Networks, Inc., San Francisco, CA (US)

(*) Notice: Subject to any disclaimer, the term of this patent is extended or adjusted under 35 U.S.C. 154(b) by 302 days.

(21) Appl. No.: 10/572,951

(22) PCT Filed: Sep. 21, 2004

(86) PCT No.: PCT/US2004/031028

§ 371 (c)(1),
(2), (4) Date: Mar. 21, 2006

(87) PCT Pub. No.: WO2005/031999

PCT Pub. Date: Apr. 7, 2005

(65) Prior Publication Data

US 2007/0040631 A1     Feb. 22, 2007

Related U.S. Application Data

(60) Provisional application No. 60/504,684, filed on Sep. 22, 2003.

(51) Int. Cl.
*H03H 7/30*     (2006.01)

(52) U.S. Cl. .......... 333/139; 333/140; 333/156; 333/164

(58) Field of Classification Search .......... None
See application file for complete search history.

(56) References Cited

U.S. PATENT DOCUMENTS

| | | | |
|---|---|---|---|
| 3,423,688 A * | 1/1969 | Seidel | 330/53 |
| 4,153,886 A | 5/1979 | Miedema | |
| 5,019,793 A | 5/1991 | McNab | |
| 5,355,103 A | 10/1994 | Kozak | |
| 2006/0164145 A1 * | 7/2006 | Poskatcheev | 327/276 |

OTHER PUBLICATIONS

International Search Report—PCT/US2004/31028 dated Feb. 22, 2005.

* cited by examiner

*Primary Examiner*—Robert J. Pascal
*Assistant Examiner*—Kimberly E Glenn
(74) *Attorney, Agent, or Firm*—Katten Muchin Rosenman LLP

(57) ABSTRACT

An apparatus and method for providing an electrically adjustable RF delay in which a splitter splits an input signal into two signal paths, one signal path providing a delay fixed at an integral number of wavelengths of a desired center frequency and both signal paths providing electrically adjustable attenuation. A combiner combines the signals passing through the signal paths, such that the sum of the electrically-adjustable attenuation provided by the signal paths adds to unity, whereby the input signal is delayed by an adjustable time depending upon the attenuations provided by the signal paths.

7 Claims, 2 Drawing Sheets

METHOD AND APPARATUS FOR ELECTRICALLY ADJUSTING DELAY IN RADIO-FREQUENCY SYSTEMS

This application is a U.S. National Phase Patent Application that claims the benefit under 35 U.S.C. § 365 of International Application No. PCT/US2004/031028, filed Sep. 21, 2004, which claims priority to U.S. Provisional Application No. 60/504,684, filed Sep. 22, 2003, the entire contents of each of which are hereby incorporated by reference herein.

FIELD OF THE INVENTION

The present invention relates to adjustable radio-frequency delay elements. More specifically, the present invention relates to apparatus for electrically adjusting delay in a radio-frequency systems.

BACKGROUND OF THE INVENTION

Various radio-frequency systems, notably feed forward amplifiers and predistorters, require the adjustment of delay through signal paths. This is typically done by varying lengths of transmission line, tuning filters for group delay, adding fixed delay increments, or other methods. All of these approaches require mechanical adjustment, circuit modifications, or other operations that greatly complicate the manufacturing process and increase cost. There is a need for a method to electrically adjust the delay in these applications without introducing complications or impairments that render the approach unworkable.

SUMMARY OF THE INVENTION

According to one aspect of the invention, there is provided an electrically adjustable RF delay element, including a splitter to split an input signal into two signal paths. One signal path is delayed by a fixed integral number of wavelengths of a desired center frequency and both signal paths are attenuated using electrically adjustable attenuation such that the sum of the electrically adjustable attenuation provided by the signal paths adds to unity. A combiner then combines the signals passing through the signal paths. The input signal is delayed by an adjustable time depending upon the attenuations provided by the signal paths.

Preferably, a balanced variable attenuator provides the splitter and signal paths and an RF delay element having a delay fixed at an integral number of wavelengths of a desired center frequency. The fixed delay element is connected between port 3 of the balanced variable attenuator and a first input of the combiner and a second input of the combiner is connected to port 2 of the balanced variable attenuator, whereby an RF signal applied to port 1 of the balanced variable attenuator is delayed by an adjustable time depending upon the degree of attenuation provided by the balanced variable attenuator and is provided at the output of the combiner.

Preferably, the balanced variable attenuator is formed from identical shunt-mounted reflective attenuators are connected between a pair of quadrature hybrid couplers or by identical series-mounted reflective attenuators are connected between a pair of quadrature hybrid couplers. Preferably, the reflective attenuators are PIN diodes.

According to another aspect of the invention, there is provided a method for providing an electrically adjustable delay of an RF signal. The method includes the steps of splitting the RF signal into two intermediate signals; delaying one intermediate signal by a fixed integral number of wavelengths of a desired center frequency; attenuating both intermediate signals by electrically-adjustable attenuation factors such that the sum of the attenuation factors is unity; and combining the intermediate signals into an output signal.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Delay is equal to the negative of the first derivative of phase with respect to time. As such, it should be realized that any approach used to adjust delay must not just adjust phase, but actual delay.

In general, each embodiment of the invention uses two signal paths, one that has a fixed delay greater than the other by $N/F_0$ where N is an integer and $F_0$ is the center frequency of the intended system. The non-delayed path is multiplied by a scalar A that can have a value from 0 to 1, and the delayed path is multiplied by a scalar equal to $(1-A)$. The two products are then summed, and since the delay difference between them is equal to N wavelengths, they add in phase. The resulting delay of the combined signals is equal to zero when $A=1$, and is equal to $N/F_0$ when $A=0$. Between $A=0$ and $A=1$, the delay scales linearly. The useful bandwidth over which this relationship holds true is inversely proportional to N. In practical application, the limit of N is about 4 for reasonable bandwidth.

Figure 1:
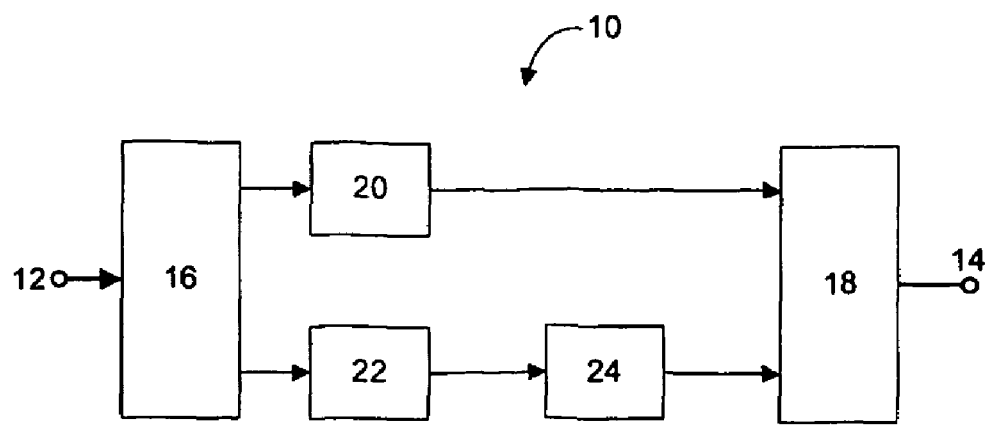
FIG. 1 is a block diagram of an electrically adjustable delay element in accordance with an embodiment of the present invention.

Referring now specifically to FIG. 1, an electrically adjustable RF delay element in accordance with an embodiment of the invention is indicated generally by reference numeral 10. The delay element 10 has an RF input port 12 and an RF output port 14. Two signal paths run from the RF input port 12 to the RF output port 14. An input signal received at the RF input port 12 is split by a splitter 16 into two paths which are recombined at a combiner 18 and feed to the RF output port 14. The first of the two paths includes a first attenuator 20 and the second path includes a second attenuator 22 and a fixed delay element 24. As mentioned above the two paths have delays that differ by $N/F_0$ seconds and the attenuators 20, 22 are adjustable so that the sum of their attenuations factors is constant.

A difficulty arises in attempting to multiply the delayed and non-delayed signals by A and $(1-A)$. While it is possible to split an input signal, multiply the output signals with separate variable attenuators by A and $(1-A)$, delay the second signal, and then recombine, there are problems with this approach. First, A and $(1-A)$ are linear parameters which are difficult to accurately produce using conventional attenuators, which are typically linear in dB. It is doubly difficult to produce A and a perfectly matching (1−A). Second, splitting the input signal in two and then later recombining yields a minimum insertion loss of 6 dB. It is desirable to keep the insertion loss as low as possible. Hence, while it is believed that an embodiment of the invention shown in FIG. 1 using conventional attenuators can provide an electrically variable delay, the other embodiments described below in relation to FIGS. 4 and 5, which utilize modifications of the conventional balanced variable attenuators depicted in FIGS. 2 and 3, are preferable.

Figure 2:
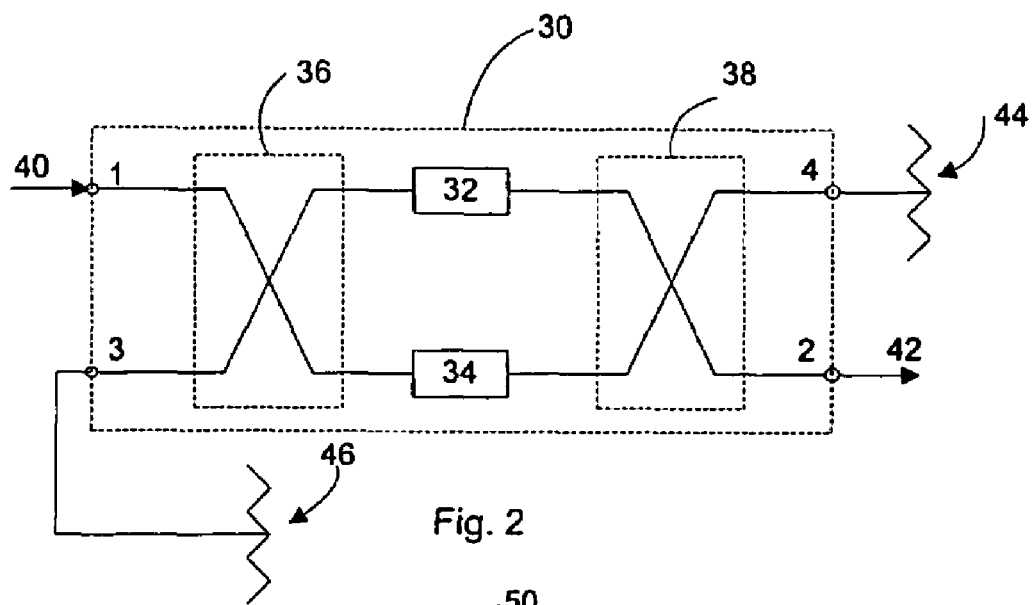
FIG. 2 is a block diagram of a conventional balanced attenuator using PIN diodes in a series configuration.

FIG. 2 depicts a conventional balanced variable attenuator, generally indicated by reference numeral 30, in which identical series-mounted reflective attenuators 32, 34 are connected between an appropriately connected pair of quadrature hybrid couplers 36, 38. Reflective attenuators 32, 34 are typically PIN diodes. The conventional balanced variable attenuator 30 has four ports, usually referred to as ports 1 to 4. Ports 1 and 3 are connected to one quadrature hybrid coupler 36, whereas ports 2 and 4 are connected to the other hybrid coupler 38. Port 1 is connected to an RF input 40, while port 2 is connected to an RF output 42. The port 3 and 4 are terminated with terminators 44, 46. If PIN diodes are used as attenuators 32, 34, then the attenuation between the RF input 40 and the RF output 42 may be controlled by varying the bias on the attenuators 32, 34 in a manner understood by those skilled in the art.

Figure 3:
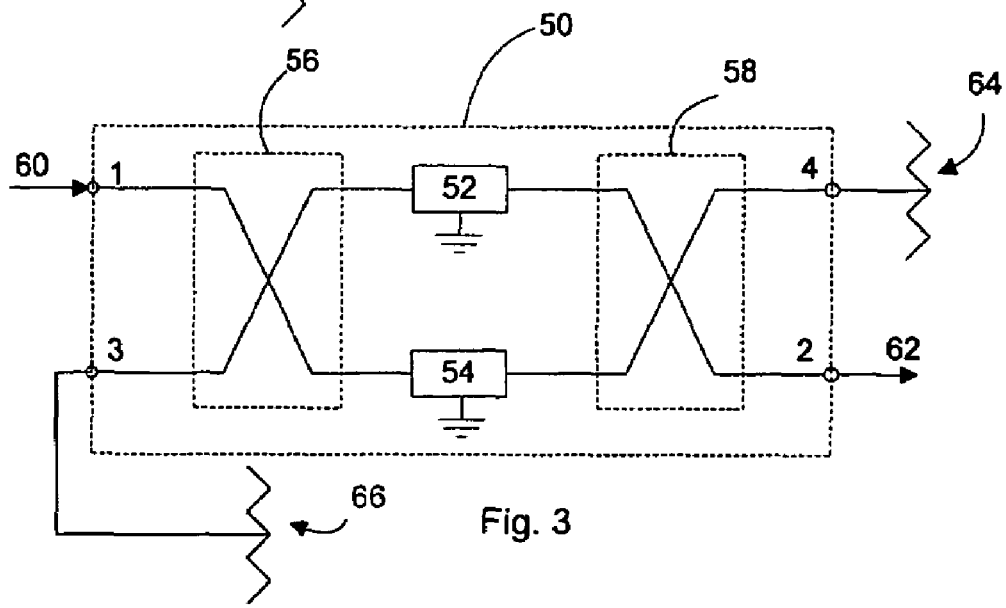
FIG. 3 is a block diagram of a conventional balanced attenuator using PIN diodes in a shunt configuration.

Similarly, FIG. 3 depicts an alternative form of conventional balanced variable attenuator, generally indicated by reference numeral 50, in which identical shunt-mounted reflective attenuators 52, 54 are connected between an appropriately connected pair of quadrature hybrid couplers 56, 58. Reflective attenuators 52, 54 are typically PIN diodes. The conventional balanced variable attenuator 50 has four ports, usually referred to as ports 1 to 4. Ports 1 and 3 are connected to one quadrature hybrid coupler 56, whereas ports 2 and 4 are connected to the other hybrid coupler 58. Port 1 is connected to an RF input 60, while port 2 is connected to an RF output 62. The port 3 and 4 are terminated with terminators 64, 66. If PIN diodes are used as reflective attenuators 52, 54, then the attenuation between the RF input 60 and the RF output 62 may be controlled by varying the bias on the reflective attenuators 52, 54 in a manner understood by those skilled in the art.

Figure 4:
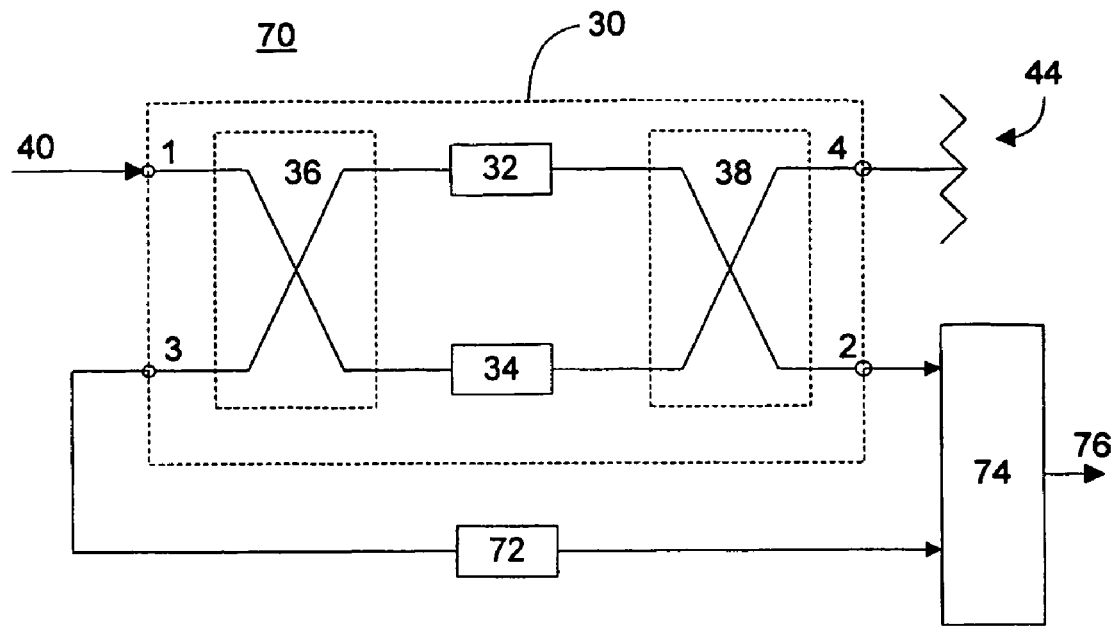
FIG. 4 is a block diagram of an electrically adjustable delay element in accordance with an embodiment of the present invention using PIN diodes in a series configuration.
Figure 5:
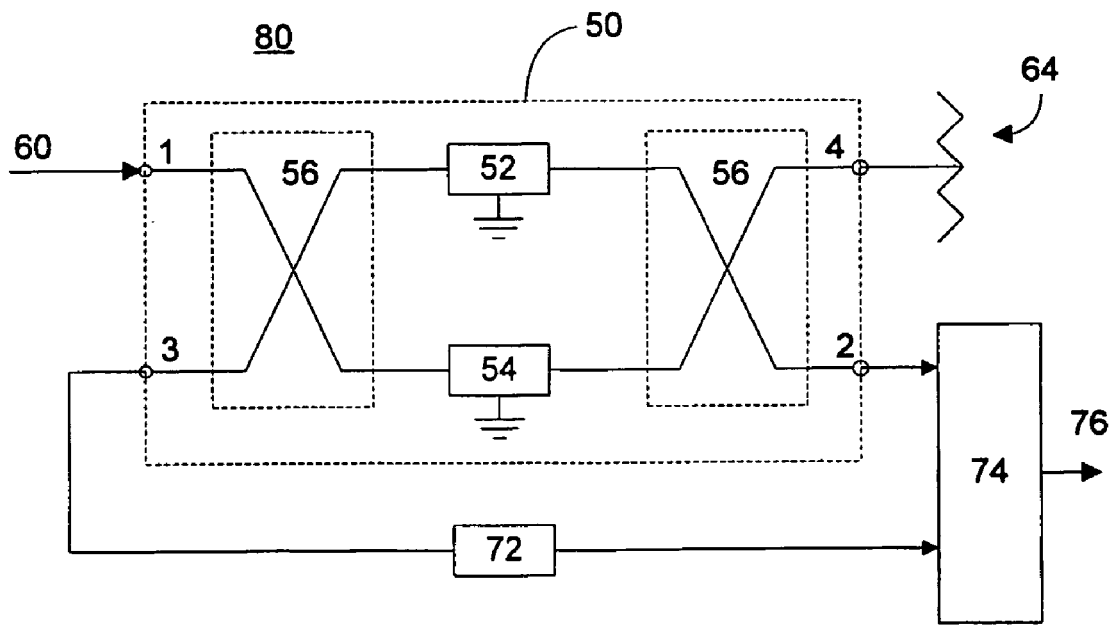
FIG. 5 is a block diagram of an electrically adjustable delay element in accordance with an embodiment of the present invention using PIN diodes in a shunt configuration.

The embodiments of the invention shown in FIGS. 4 and 5, are each a modification of one of the conventional balanced variable attenuators 30, 50 shown in FIGS. 2 and 3. As such, the same reference numerals are used where appropriate.

In the electrically-adjustable RF delay elements indicated generally by reference numeral 70 in FIG. 4 and reference numeral 80 in FIG. 5, the termination 46, 66 connected to port 3 of the balanced variable attenuator 30, 50 has been replaced by a delay element 72 connecting port 3 of the balanced variable attenuator 30, 50 to an input of a combiner 74. The delay element 72 provides a fixed delay of $N/F_0$, as discussed above, which means that the phase of a signal passing through the delay element 72 is unaffected. Port 2 of the balanced attenuator 30, 50 is now connected to the other input of the combiner 74 and the output of the combiner 74 becomes the RF output 76 of the electrically-adjustable RF delay element 70, 80.

The delay provided by either form of electrically-adjustable RF delay element 70, 80 is varied by adjusting the bias applied to the reflective attenuators 32, 34, 52, 54. If the voltage transfer characteristic from port 1 to port 2 of either form of electrically-adjustable RF delay element 70, 80 is S21 and the voltage transfer characteristic from port 1 to port 3 is S31, then |S31|+|S21|=1. Therefore |S31|=1−|S21|, which is the characteristic needed to feed the non-delayed and delayed paths. Stated equivalently, if the attenuation from node 1 to node 2 is A, then the attenuation from node 1 to node 3 must be (1−A), which is exactly what is needed. Further, the phases of the signals at the inputs of the combiner 74 are the same at −90 degrees. The combiner 74 is shown as an in-phase combiner although it is possible to use a quadrature combiner as long as the 90-degree phase difference is accounted for in the delay element 72.

This approach has two distinct advantages. First, scalars A and (1−A) are accurately created by the action of the modified balanced attenuator. This would be very difficult to accomplish with a pair of attenuators. Second, the insertion loss of this approach is 3 dB, which is 3 dB less than the approach using two attenuators.

The above-described embodiments of the invention are intended to be examples of the present invention and alterations and modifications may be effected thereto by those of skill in the art without departing from the scope of the invention that is defined solely by the claims appended hereto.

The invention claimed is:

1. An electrically-adjustable RF delay element, comprising a splitter to split an input signal into two signal paths, one signal path providing a delay fixed at an integral number of wavelengths of a desired center frequency and both signal paths providing electrically-adjustable attenuation, and a combiner having two inputs and an output for combining signals passing through the signal paths, such that the sum of the electrically-adjustable attenuation provided by the signal paths adds to unity, whereby the input signal is delayed by an adjustable time depending upon the attenuations provided by the signal paths and is provided at the output of the combiner.

2. The electrically-adjustable RF delay element of claim 1, the splitter and signal paths comprising a balanced variable attenuator and an RF delay element having a delay fixed at an integral number of wavelengths of a desired center frequency, wherein the fixed delay element is connected between port 3 of the balanced variable attenuator and a first input of the combiner and a second input of the combiner is connected to port 2 of the balanced variable attenuator, whereby an RF signal applied to port 1 of the balanced variable attenuator is delayed by an adjustable time depending upon the degree of attenuation provided by the balanced variable attenuator and is provided at the output of the combiner.

3. The electrically adjustable RF delay element of claim 2, wherein the balanced variable attenuator comprises identical shunt-mounted reflective attenuators connected between a pair of quadrature hybrid couplers.

4. The electrically adjustable RF delay element of claim 3, wherein the shunt-mounted reflective attenuators are PIN diodes.

5. The electrically adjustable RF delay element of claim 2, wherein the balanced variable attenuator comprises identical series-mounted reflective attenuators connected between a pair of quadrature hybrid couplers.

6. The electrically adjustable RF delay element of claim 5, wherein the shunt-mounted reflective attenuators are PIN diodes.

7. A method for providing an electrically-adjustable delay of an RF signal, comprising:
  splitting the RF signal into two intermediate signals;
  delaying one intermediate signal by a fixed integral number of wavelengths of a desired center frequency;
  attenuating both intermediate signals by electrically adjustable attenuation factors such that the sum of the attenuation factors is unity; and
  combining the intermediate signals into an output signal.

* * * * *

UNITED STATES PATENT AND TRADEMARK OFFICE
CERTIFICATE OF CORRECTION

PATENT NO.         : 7,456,706 B2
APPLICATION NO. : 10/572951
DATED              : November 25, 2008
INVENTOR(S)      : James R. Blodgett Page 1 of 1

It is certified that error appears in the above-identified patent and that said Letters Patent is hereby corrected as shown below:

Column 4, Line 55, "the shunt-mounted reflective attenuators" should read --the series-mounted reflective attenuators--.

Signed and Sealed this

Third Day of March, 2009

JOHN DOLL
*Acting Director of the United States Patent and Trademark Office*